United States Patent [19]

Adams

[11] Patent Number: 4,924,226
[45] Date of Patent: May 8, 1990

[54] SIGNAL ERROR COMPENSATION

[75] Inventor: Robert W. Adams, Acton, Mass.

[73] Assignee: Carillon Technology, Inc., Sunnyvale, Calif.

[21] Appl. No.: 226,401

[22] Filed: Jul. 29, 1988

[51] Int. Cl.$^5$ .............................................. H03M 1/60
[52] U.S. Cl. .................................. 341/157; 341/51; 341/143; 341/118
[58] Field of Search ................. 341/143, 163, 166, 51, 341/157, 143, 118

[56] References Cited

U.S. PATENT DOCUMENTS

| | | | |
|---|---|---|---|
| 4,146,743 | 3/1979 | Raynham | 341/53 |
| 4,439,756 | 3/1984 | Shenoi et al. | 341/143 |
| 4,528,551 | 7/1985 | Agrawal et al. | 341/143 |
| 4,578,667 | 3/1986 | Hollister | 341/163 |
| 4,588,979 | 5/1986 | Adams | 341/143 |
| 4,829,299 | 5/1989 | Mandell | 341/51 |

Primary Examiner—William M. Shoop, Jr.
Assistant Examiner—Helen Kim
Attorney, Agent, or Firm—Schiller, Pandiscio & Kusmer

[57] ABSTRACT

A system is described for correcting errors in a waveform comprising a plurality of binary pulses, each having a different rise time and fall time with respect to the positive going and negative going transitions of each pulse. The system generates a plurality of correction pulses, each synchronously with a corresponding positive going or negative going transition of the binary pulses; and adds each of the correction pulses to the waveform so that the signal area lost by the rise characteristic of the resulting binary pulses will equal the signal area gained by the fall characteristics of the resulting binary pulses.

24 Claims, 5 Drawing Sheets

SIGNAL ERROR COMPENSATION

The present invention relates generally to signal error compensation, and more particularly to improved distortion cancellation in a noise-shaping A/D converter.

Figure 1:
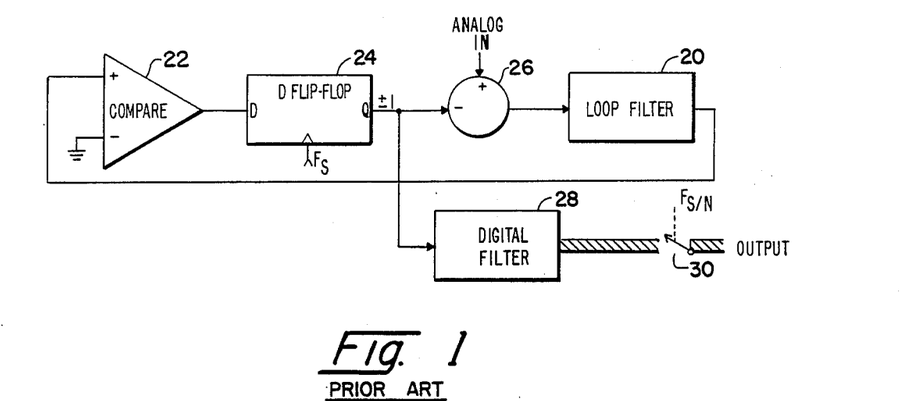
FIG. 1 is a block diagram of a prior art A/D converter using a sigma delta modulator feeding a digital filter/deciminator.

A/D converters using sigma delta modulators are well known. See, for example, my U.S. Pat. No. 4,588,979 issued May 13, 1986, and assigned to the present assignee. The basic converter employing a sigma delta modulator is shown in FIG. 1. The modulator typically includes a loop filter 20, including a signal integrator with high gain at low frequencies and decreasing gain at higher frequencies, a comparator 22 and a D-type flip flop or latch 24 which functions as a one bit clocked D/A converter. The flip flop is clocked by a clocking signal at the sampling rate $F_s$. The output of the flip flop is algebraically added (in this case subtracted) from the analog input signal at the summing junction 26, with the difference being applied to the input of filter 20. The effect of the loop filter 20 is to shape the noise introduced by the crude (one bit) quantizer so that at frequencies well below the sampling frequency a relatively high dynamic range is achieved. The digital output signal of the modulator is obtained from the output of the flip flop 24 and applied to the input of a digital filter 28, which in turn removes the high-frequency noise components. The output of this filter is then downsampled at a lower rate ($F_s/N$) by a decimator 30, where N is the downsampling ratio.

Figure 2:
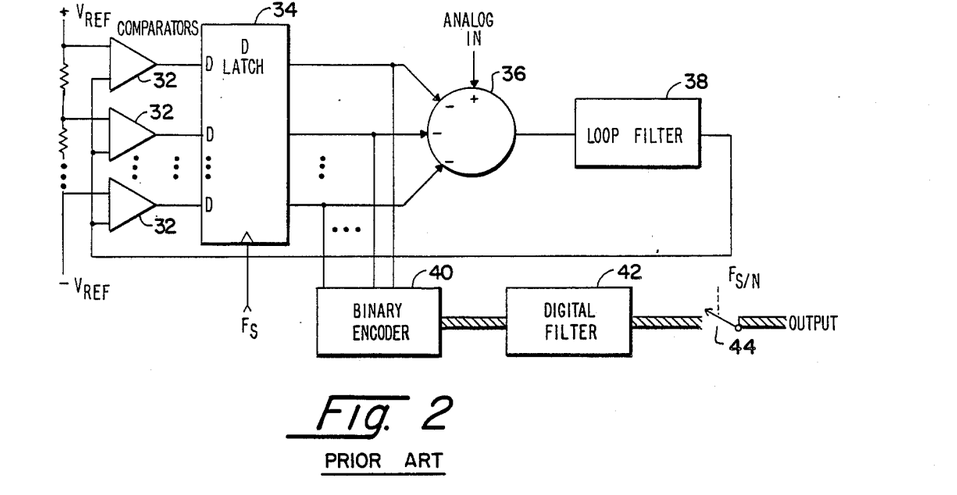
FIG. 2 is a block diagram of a prior art A/D converter using a stacked sigma delta modulator feeding a digital filter/deciminator.

A prior art noise-shaping A/D converter employing a "stacked" sigma delta modulator arrangement is shown in FIG. 2. The stacked arrangement is achieved by using a plurality of comparators 32 and corresponding plurality of D-type latches 34 having a plurality of outputs summed together and algebraically added (in this case subtracted) from the input signal at the summing junction 36. Latches 34 are clocked by a clocking signal at the sampling rate $F_s$. The difference between the analog input signal and the summed outputs of the latches 34 is applied to the loop filter 38 which is similar to loop filter 20, which in turn has its output applied to the inputs of the comparators 32. The digital filter 38 operates as in the FIG. 1 arrangement so as to remove high-frequency noise and decrease the sampling rate. The outputs of the latches 34 are applied to a binary encoder 40 for converting the outputs of the latches to a binary encoded digital signal. The latter is applied to a digital filter 42 similar to filter 28, and subsequently to a decimator 44 which lowers the sampling rate to $F_s/N$. The A/D converter shown in FIG. 2 achieves a wider dynamic range than that shown in FIG. 1 by using a multi-bit quantizer in the feedback loop.

Figure 3:
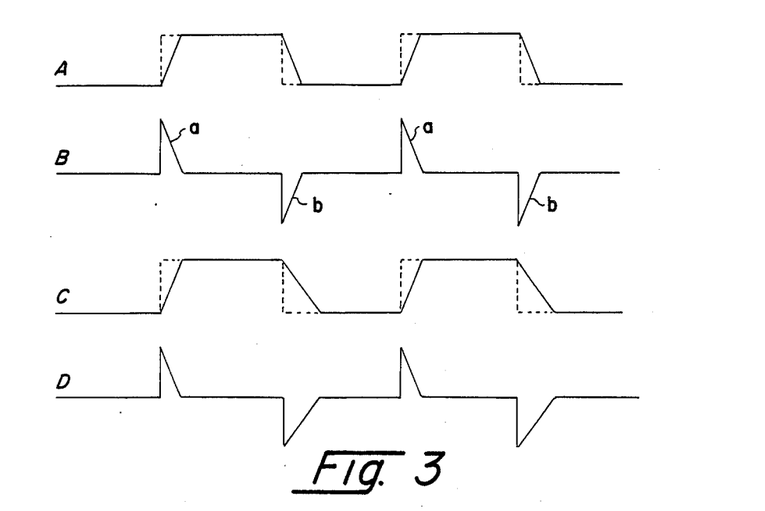
FIG. 3A–3D are graphical illustrations of pulse waveforms for showing typical errors attributable to unequal rise and fall times of the pulses of the waveforms.

FIG. 3A shows an example of the predicted waveform appearing at the output of the sigma delta modulator, i.e., the output of the flip flop 24 of FIG. 1 and each output of the latches 34 of FIG. 2. Since the loop filter integrates the output of the signal junction of each of the arrangements shown in FIGS. 1 and 2, ideally the rise time of the waveform (a positive going transition of the signal where the signal changes from a −1 state to a +1 state) and the fall time of the waveform (a negative going transition of the signal where the signal changes from a +1 state to a −1 state) will be instantaneous (as indicated by the dotted lines in FIG. 3A). However, as a practical matter the waveform will exhibit rise and fall times of a finite period. Preferably, the rise and fall times are the exact complement of one another as indicated by the waveform shown in FIG. 3B, so that no errors will be introduced in the integration by the loop filter. The waveform shown in FIG. 3B is the error waveform for equal rise and fall times of the waveform shown in FIG. 3A so that the effective area under each positive error, as indicated for example at "a" in FIG. 3B will equal the effective area under each negative error, as indicated for example at "b" in FIG. 3B. Under these conditions there will be no distortion in the output of the modulator due to the rise and fall times of the waveform as shown in FIG. 3A since the amount of area lost by the action of the finite rise time is gained by the action of the finite fall time and thus the integration error will be zero. Since the digital filters 28 and 42, respectively of FIGS. 1 and 2, will assume that the value of a +1 state is precisely equal and opposite the value of a −1 state, there is no error at the output of the digital filter.

More typically, however, the rise and fall times are unequal as illustrated by the waveform shown in FIG. 3C. The difference between the ideal waveform (shown in dotted lines) and the actual signal results in the errors shown in FIG. 3D. It is clear that the positive errors are no longer the exact complement of each other and are no longer symmetrical. Thus, as seen by the digital filters 28 and 42, the effective value (area) provided by a +1 state is different from the effective value (area) of a −1 state. If one considers the effect of two successive pulses, one at a +1 state and the other at a −1 state, the overall effect would merely be an offset error. However, since the output of each flip flop or latch is a series of pulses which may or may not provide an equal number of pulses of a +1 state and a −1 state (and more likely not), a serious problem arises since the net area provided by the positive and negative errors shown in FIG. 3D will vary depending upon the sequence of the pulses. Thus, for example, a +1, −1, +1 sequence will be different from that of a +1, +1, −1 sequence because the former has two transitions and the latter only one since no transition occurs between the two successive +1 pulses. Thus, the effective value of the sequence of a plurality of pulses can depend upon the order of the pulses. The digital filter 28 and 42 assumes that the value of a pulse is independent of the pulses surrounding it. This results in excess noise at the output. It also causes harmonic distortion when the modulator is used for digitizing audio information.

Figure 5:
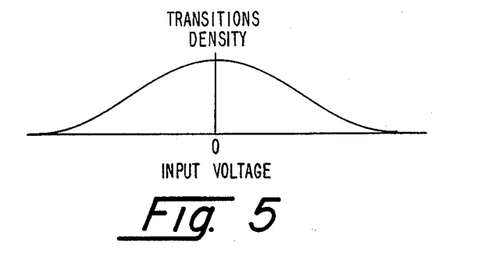
FIG. 5 is a graphical illustration showing the relationship between latch transition density of the output of a latch or flip flop providing the type of waveform shown in FIG. 3D and the input signal for the sigma delta modulator.

More specifically, when the analog signal input to a sigma delta modulator is 0, the output of the flip flop 24, or in the case of a "stacked" arrangement each output of the latches 34, spends an equal amount of time in the +1 state as in the −1 state since the output of the flip flop or latches will alternate between the two states. If a slowly varying DC signal is applied to the sigma delta modulator, the flip flop and latch outputs begin to spend more time in one state than the other so that the average value tracks the input signal. Further, the number of latch transitions per unit time is maximum with 0 volts applied and decreases with increasing voltage of either polarity applied to the input. This is due to the fact that long strings of pulses in the +1 state or long strings of pulses in the −1 state become more common as the DC value of the output of the flip flop or latches varies in one direction or the other. The relationship between a DC input level and the number of transitions per unit time, i.e., transition or switching density, is graphically illustrated in FIG. 5.

Figure 4:
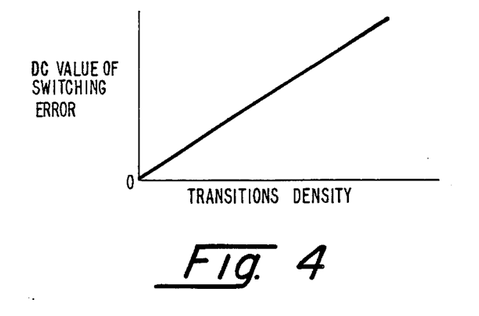
FIG. 4 is a graphical illustration showing the relationship between the average value of latch error signal and transition density of the output of a latch or flip flop providing the type of waveform shown in FIG. 3D.

Referring again to FIG. 3D, it is clear that there is a net DC component to the switching error waveform. The DC value of this error waveform depends both on the magnitude of the difference in rise and fall times, as well as the number of transitions per unit time. This is shown in the graph illustrated in FIG. 4, which shows a linear relationship between the DC error and the transition density.

Figure 6:
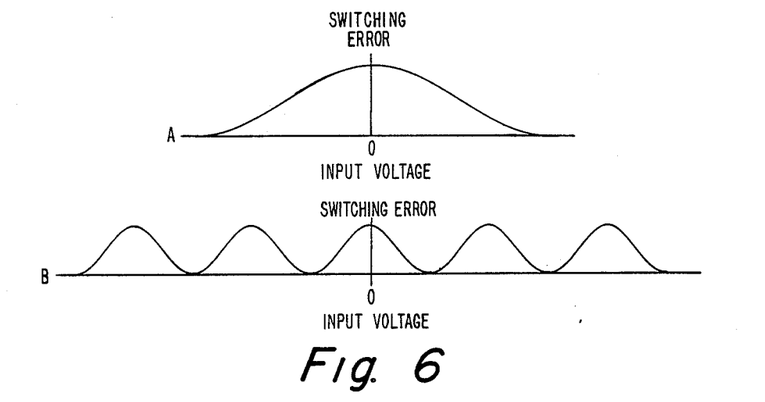
FIGS. 6A and 6B are graphical illustrations showing the relationship between the DC component of the latch's error signal and the input signal to the corresponding single latch and stacked sigma delta modulators respectively shown FIGS. 1 and 2.

Since the average DC value of the switching error signal is proportional to switching density, the plot of error versus input level will have the same shape as the plot of transition density versus input level. This relationship is shown in FIG. 6A for the single flip-flop arrangement of FIG. 1, and FIG. 6B for the stacked arrangement of FIG. 2. In the latter case the error curve repeats itself for each level of the quantizer. The error curve results in an even-order harmonic distortion at the output of the digital filter.

Accordingly, it is a general object of the present invention to eliminate or at least reduce the above-noted problems of the prior art.

A more specific object of the present invention is to provide an improved device for compensating for errors and distortion due to unequal rise and fall times of pulses of a waveform containing such pulses.

Another more specific object of the present invention is to provide an improved sigma delta modulator in which errors and distortion due to unequal rise and fall times of pulses of the quantizer(s) of the modulator are reduced or substantially eliminated.

These and other objects of the present invention are achieved by a system for use in correcting errors in a waveform comprising a plurality of binary pulses, each having a different rise time and fall time with respect to the positive going and negative going transitions of each pulse. The system comprises:

means for generating a plurality of correction pulses, each synchronously with a corresponding positive going or negative going transition of the binary pulses; and means for adding each of said correction pulses to said waveform so that the signal area lost by the rise characteristic of the resulting binary pulses will equal the signal area gained by the fall characteristics of the resulting binary pulses.

Other objects of the invention will in part be obvious and will in part appear hereinafter. The invention accordingly comprises the product possessing the features, properties and relation of components which are exemplified in the following detailed disclosure, and the scope of the application of which will be indicated in the claims.

For a fuller understanding of the nature and objects of the present invention, reference should be had to the following detailed description taken in connection with the accompanying drawings wherein.

In the drawings the same numerals are used to refer to like parts.

Figure 7:
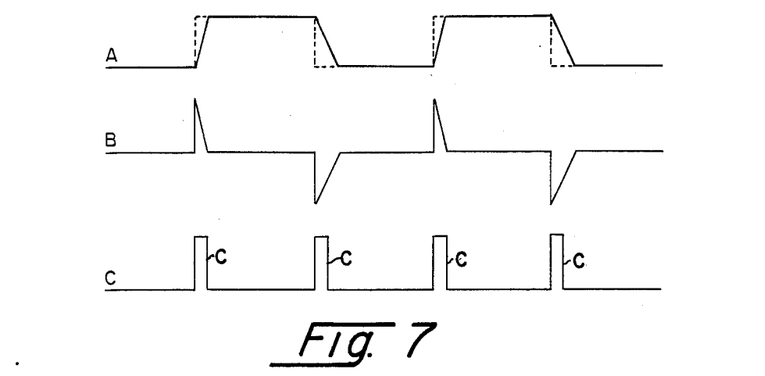
FIGS. 7A–7C are graphical illustrations showing a correction signal, in the form of pulses triggered by each transition of the latch output, for correcting the error introduced due to unequal rise and fall times of the pulse output of the modulator.

Referring to FIG. 7, the basic approach for correcting the errors due to different rise and fall times of a pulse waveform in accordance with the present invention is graphically illustrated. FIGS. 7A and 7B show the waveform including unequal rise and fall times and the resulting switching error waveform, as previously described with respect to FIGS. 3C and 3D. The correction signal generated in accordance with the present invention is shaped so as to add a certain amount of signal area to the pulsed waveform so as to equalize the positive and negative errors of the signal shown in FIG. 7B.

Accordingly, a signal similar to the waveform shown in FIG. 7C can be generated so that the correction pulses indicated at "c" are synchronous with the positive and negative errors shown in FIG. 7B. These correction pulses are subtracted from the waveform of FIG. 7A so that the area associated with the rise times and that of the fall times of the combined waveforms of FIG. 7A and 7C are substantially equal and the resulting pulses will have the property that the area lost due to the rise characteristics of the pulses will be that gained by the fall characteristics of the pulses. More specifically, the characteristics of the pulse during the rise time of the pulse is represented, in part, by the area under the pulse during the time the pulse is changing from a $-1$ state to a $+1$ state. The signal area lost due to the rise characteristics (error due to the non-ideal shape of the pulse) is shown at "a" in FIG. 3B. The characteristics of the pulse during the fall time of the pulse is represented, in part, by the area under the pulse during the time the pulse is changing from a $+1$ state to a $-1$ state. The signal area gained due to the fall characteristics (error due to the non-ideal shape of the pulse) is shown at "b" in FIG. 3B. It is clear that by choosing the correct amplitude and pulse width of the correction pulses, the combined areas of the positive error and correction pulse (both positive areas and therefore added together), and the combined areas of the negative error and correction pulse negative errors (the correction pulse having a positive area while the negative error exhibiting a negative area so that the former is subtracted from the latter) will be equal in area and opposite in polarity. The correction pulses can be equal in amplitude and pulse width as shown in FIG. 7C. Alternatively, the correction pulses added to the positive going transitions can be shaped differently from the correction pulses added to the negative going transitions so long as the combined area for the negative going transitions of the combined signal (original waveform and the correction signal) equals the combined area for the positive going transitions of the combined signal.

Figure 8:
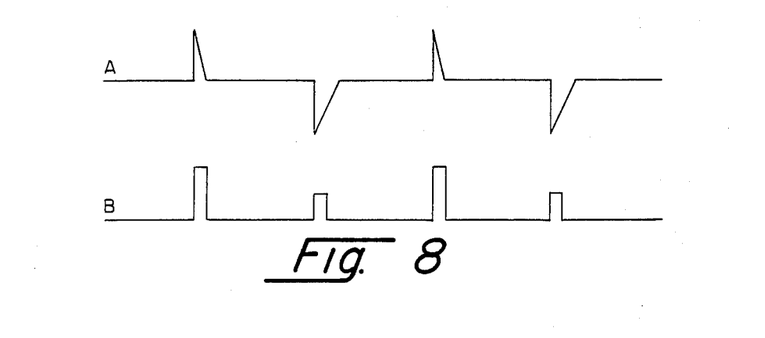
FIGS. 8A and 8B are graphical illustrations showing a correction signal, in the form of pulses of unequal amplitude triggered by each transition of the latch output, for correcting the error introduced due to unequal rise and fall times of the pulse output of the modulator.

Thus, as shown in FIGS. 8A and 8B, the pulses added to the positive going transitions can be of a different amplitude and/or pulse width than the pulses added to the negative going transitions which define equal (as seen in FIG. 7C) or unequal areas (as seen in FIG. 8B). However, when subtracted from the respective portions of the original waveform, the resulting positive and negative going transitions of the combined signal will be equal and opposite. In fact the correction pulses added to the negative going transitions of the original signal can be of opposite polarity to the pulses added to the positive going transitions, so long as the area under each of the former type correction pulses is not equal and opposite to the area under each of the latter type correction pulses, in which case no correction can be provided.

Figure 9:
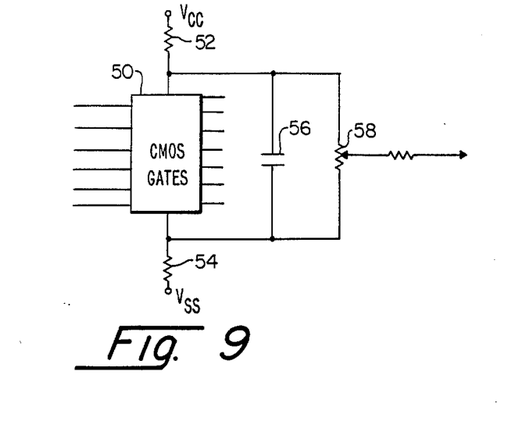
FIG. 9 is a partial schematic and partial block diagram of the one embodiment of the present invention for providing an analog compensation signal for correcting for errors attributable to unequal rise and fall times of pulses of a waveform.
Figure 10:
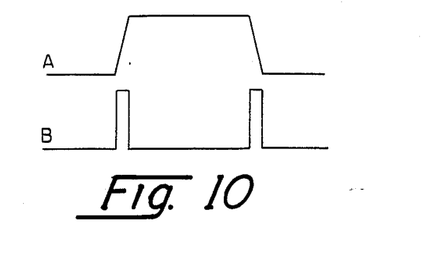
FIGS. 10A and 10B are graphical waveforms of the output voltage and supply current of an integrated circuit (IC) of CMOS gates or latches, such as the one shown in FIG. 9.

One embodiment for generating the correction signal is shown in FIG. 9. The correction signal is an analog signal and is generated from a commercially available integrated circuit (IC) 50, such as one containing CMOS gates, e.g., the 74HC04 chip manufactured by National Semiconductor Corp. of Santa Clara, Calif. As shown in FIG. 10 when the CMOS IC 50 switches (as shown in FIG. 10A) in response to an input signal at any one of its input terminals, a spike of current is drawn from the positive and negative power supplies, respectively $V_{cc}$ and $V_{ss}$, connected to the two power input terminals of the IC due to the fact that both N and P type semiconductor devices in IC 50 are conducting for a short period of time (as shown in FIG. 10B). Theoretically, each current pulse shown in FIG. 10B is always of the same amplitude, pulse width and direction (as shown positive). Accordingly, each current pulse can be converted to a voltage pulse by placing a relatively small resistor (e.g., $<100$ ohms) in each power supply lead as indicated at 52 and 54. The two leads are respectively connected to opposite sides of a capacitor 56 and to opposite sides of the resistor of a potentiometer 58. Capacitor 56 provides some filtering of the cancellation signal derived from the pulses provided in the leads 52 and 54. The polarity and amplitude of the correction signal can be controlled by the position of the wiper of the potentiometer. More specifically, the middle position of the wiper should provide no pulse. Moving the wiper from the middle position toward the $V_{cc}$ supply creates a positive pulse with an increasingly positive amplitude. Moving the wiper from the middle position toward the $V_{ss}$ supply creates a negative pulse with an increasingly negative amplitude.

In practice, although not shown, there also may be a component of supply current generated in the leads 52 and 54 that is needed to charge the stray output capacitance, and this may make the spike currents at the power supplies slightly different for positive going transitions from negative going transitions. However, as previously described it is still possible to obtain complete cancellation even when the correction pulses for the positive going transitions are not equal to the correction pulses for the negative going transitions.

Figure 11:
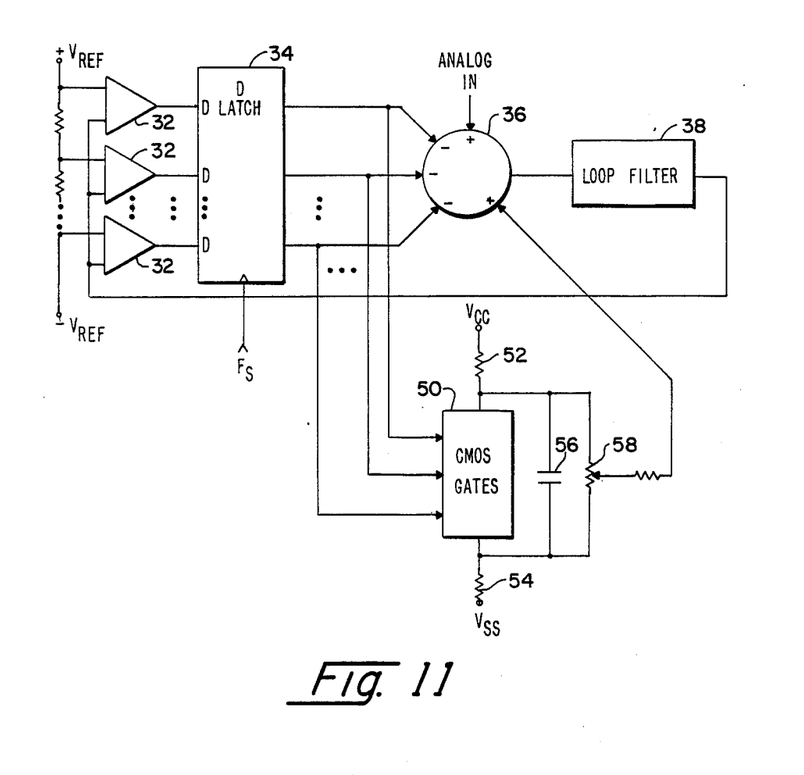
FIG. 11 is a stacked sigma delta modulator similar to the one shown in FIG. 2, and modified to include the FIG. 9 embodiment for providing an adjustable analog compensation signal.

Referring to FIG. 11, the stacked sigma delta modulator of the type shown in FIG. 2 is shown modified so as to include the FIG. 9 embodiment for generating the correction signal for correcting switching errors generated at the output of the latch or flip flop 24. As shown each output of the D-type latches 34 is connected to a corresponding input of the CMOS IC 50. The correction signal provided on the wiper of potentiometer 58 is added to the input signal and the negative sum of the outputs of the latches 34 at the summing junction 36. By adjusting the wiper of potentiometer 58 the proper correction can be provided to cancel the error resulting from the difference between the rise and fall times of the pulses appearing at the output of the latches 34.

Figure 12:
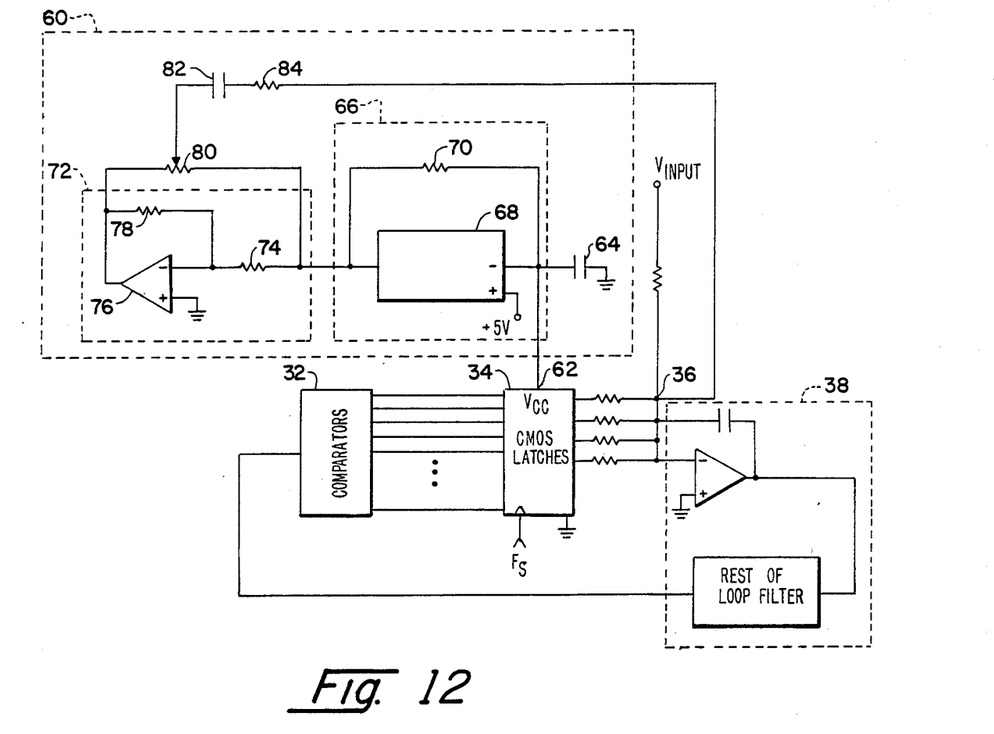
FIG. 12 is the preferred stacked sigma delta modulation similar to the one shown in FIG. 2 and modified in accordance with the present invention.

Referring to FIG. 12, the IC 50 can be omitted and the correction signal generated directly from latches 34, where the latter are provided as a CMOS IC, by the error compensation circuit 60. As shown with the $V_{ss}$ power supply terminal of the latches 34 connected to system ground, the $V_{cc}$ power supply terminal 62 is connected to a capacitor 64, which in turn is connected to system ground and to the input of a current to voltage converter 66 for converting the current pulse provided at the terminal 62 to a voltage. The capacitor 64 provides a low impedance path for signal energy above the frequencies where the circuit 60 is not capable of working. The converter keeps the supply voltage to the terminal 62 free from any AC voltages. The converter includes an operational amplifier having the $V_{cc}$ terminal of latches 34 connected to the inverting input of the amplifier, and a positive DC voltage source connected to the non-inverting input of the amplifier. A feedback resistor 70 is provided between the inverting input and output of the amplifier 68.

The voltage output of the amplifier 68 is connected to a signal inverter 72 including an input resistor 74 connected to the inverting input of the operational amplifier 76. The latter has its non-inverting input connected to system ground and its inverting input connected through resistor 78 to its output. A resistor of a potentiometer 80 is connected between the input and output of the inverter. The wiper of potentiometer 80 is connected through capacitor 82, to resistor 84. The latter, in turn, is connected to the summing junction 36 where it is added to the output signals of the latches 34.

The circuit 60 provides a correction signal to the summing junction. As in the embodiment shown in FIG. 10, the polarity and amplitude of the correction signal can be controlled by the position of the wiper of the potentiometer. More specifically, the middle position of the wiper should provide no pulse. Moving the wiper from the middle position toward the output of the converter 66 (the input of the inverter 72) creates a positive pulse with an increasingly positive amplitude. Moving the wiper from the middle position toward the output of the inverter 72 creates a negative pulse with an increasingly negative amplitude.

The resistive load on the terminal 62 of the latches 34 will introduce a small linear term in the correction voltage, but this does not interfere with the distortion cancellation. The circuit 60 is preferred when using a multi-bit converter such as shown, since extra CMOS packages are not needed to generate the correction signal. If properly designed, it can also serve as a low-noise highly-regulated DC voltage supply for the CMOS latches 34. Such a circuit is desirable in any event because the supply rail of the CMOS latches in the modulator is a sensitive input point to the sigma delta modulator.

Figure 13:
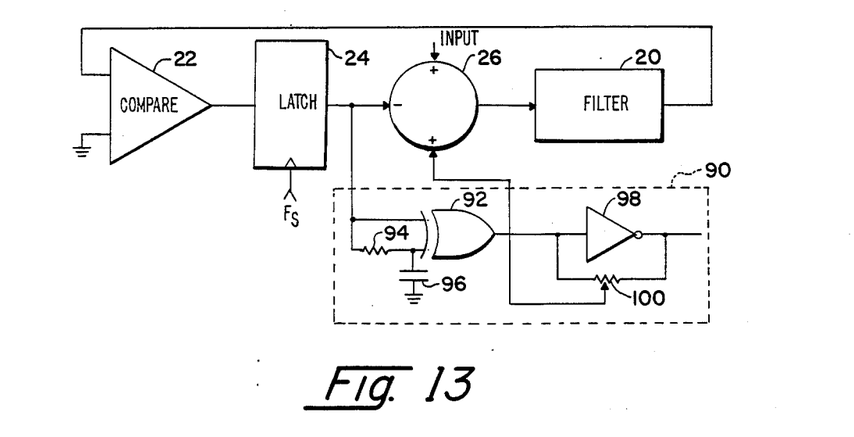
FIG. 13 is a partial schematic and partial block diagram of a sigma delta modulator similar to the one shown in FIG. 1 modified to include a second embodiment of the present invention for providing an all digital compensation signal for correcting for errors attributable to unequal rise and fall times of pulses of a waveform.

FIG. 13 shows an alternative embodiment of the present invention which utilizes all digital signal processing to generate the correction signal. Referring to FIG. 13, the sigma delta modulator shown in FIG. 1 is modified by adding the error compensation circuit 90. The output of the latch or flip flop 24 is connected to one input of XOR gate 92. The output of the latch is also connected through resistor 94 to a second input of the gate. The second input is connected through the capacitor 96 to system ground. The output of gate 92 is connected to the input of a digital signal inverter 98. The resistor of the potentiometer 100 is connected between the input and output of the inverter 98. The wiper is connected to the summing junction 26.

As shown the XOR gate will produce a positive going pulse for any transition appearing at any one of the inputs of the gate regardless of the polarity of the latter transition. The signal is inverted so as to produce a negative going pulse, equal but opposite in polarity to each positive going pulse appearing at the inverter's input. As in the previously described embodiments, the amplitude and polarity of each correction pulse is controlled by the position of the wiper of the potentiometer. Placing the wiper at the middle position of the potentiometer 100 should provide no pulse. Moving the wiper from the middle position toward the input of the inverter 98 creates a positive pulse with an increasingly positive amplitude. Moving the wiper from the middle position toward the output of the inverter 100 creates a negative pulse with an increasingly negative amplitude.

Figure 14:
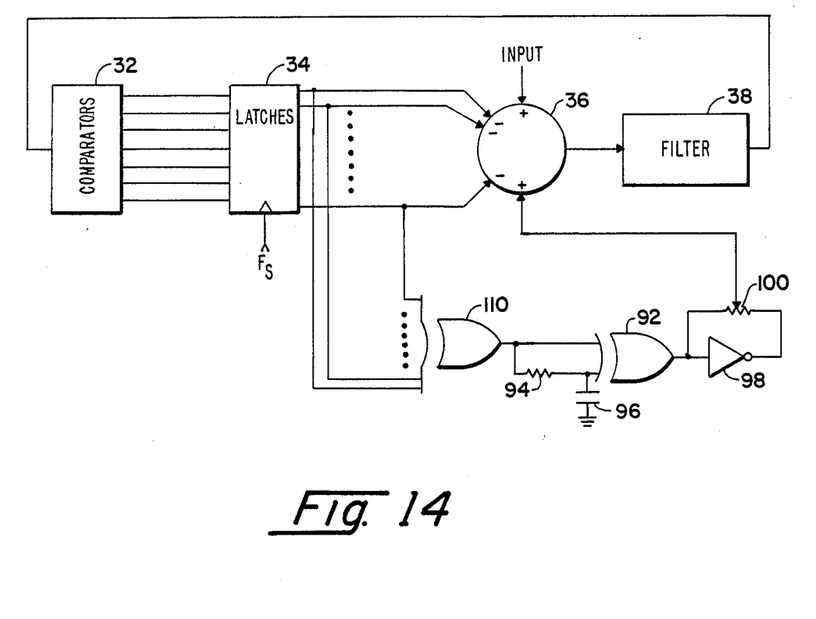
FIG. 14 is a partial schematic and partial block diagram of a stacked sigma delta modulator similar to the one shown in FIG. 2 and modified to include the variation of the second embodiment of the present invention used in the embodiment shown in FIG. 12.

As shown in FIG. 14, the signal correction circuit 90 can easily be modified for use in the multi-bit quantizer arrangement shown in FIG. 2. In this embodiment the outputs of the latches 34 are connected to corresponding inputs of the XOR gate 110. The output of gate 110 is connected to the first input of gate 92 and to the resistor 94. As in the embodiment shown in FIG. 13, the amplitude and polarity of each correction pulse is controlled by the position of the wiper of potentiometer 100. In this embodiment the assumption is made that only one latch signal will change in any clock period. If two latch signals were to change simultaneously, the output of XOR gate 110 would not change and no correction spike would be generated. Fortunately, most well-designed noise-shaping converters with high oversampling ratios meet the requirement of only having one latch line transition per clock period.

The foregoing provides apparatus for correcting for signal errors attributed to differences between the rise and fall times of positive going and negative going transitions of a pulse type waveform. The correction signals generated equalize the areas of the switching errors when they are added to the original signals. The correction pulses generated for positive going transitions of the original signal need not necessarily match those correction pulses generated for negative going transitions of the original signal. The only requirement is that the resulting areas for the positive going and negative going transitions of the compensated signal match. It has been determined that the same results will be achieved even if the correction pulses are filtered above the frequency of interest. Distortion and noise will still cancel below the cutoff frequency of the filter even though the pulses are smeared in time and in no way resemble the original time-domain pulses. This is because the spectrum of the cancellation signal below the cutoff frequency is unchanged.

Since certain changes may be made in the above apparatus without departing from the scope of the invention herein involved, it is intended that all matter contained in the above description or shown in the accompanying drawing shall be interpreted in an illustrative and not in a limiting sense.

What is claimed is:

1. A system for use in correcting errors in a waveform comprising a plurality of binary pulses, each having a different rise time and fall time with respect to the positive going and negative going transitions of each said pulse, said system comprising:
   means for generating a plurality of correction pulses, each synchronously with a corresponding positive going or negative going transition of said binary pulses; and
   means for adding each of said correction pulses to said waveform so that the signal area lost by the rise characteristic of the resulting binary pulses will equal the signal area gained by the fall characteristics of the resulting binary pulses.

2. The system according to claim 1, wherein said means for generating said plurality of correction pulses includes (a) a circuit comprising CMOS logic, at least one input terminal for receiving said waveform, and at least one power terminal, (b) means connected to the said power terminal for generating an intermediate pulse in response to each of said positive and negative going transitions of said waveform at said input terminal, and (c) means for generating a correction pulse in response to said intermediate pulse.

3. The system according to claim 2, wherein said circuit includes a pair of power terminals, and said system further includes (a) means, connected to both of said power terminals, for generating a pair of intermediate pulses in response to each of said positive and negative going transitions of said waveform at said input terminal, and (b) means for generating each of said correction pulses in response to a corresponding pair of said intermediate pulses.

4. The system according to claim 3, wherein said said pair of intermediate pulses are equal in magnitude and pulse width and opposite in polarity to one another, and said means for generating each of said correction pulses includes means for adjusting the magnitude and polarity of said correction pulses.

5. The system according to claim 4, wherein said means for adjusting the magnitude and polarity of said correction pulses includes a potentiometer including a resistor having one end coupled to one of said power terminals of said circuit, and the other end coupled to the other of said power terminals and a wiper movable relative to said resistor.

6. The system according to claim 2, wherein said means connected to said power terminal for generating said intermediate pulse includes means, responsive to said intermediate pulse, for generating an inverted pulse equal in magnitude and pulse width and opposite in polarity to said intermediate pulse, and means, responsive to said intermediate pulse and said inverted pulse, for generating said correction pulse.

7. The system according to claim 6, wherein said means for generating each of said correction pulses includes means for adjusting the magnitude and polarity of said correction pulses.

8. The system according to claim 7, wherein said means for adjusting the magnitude and polarity of said correction pulses includes a potentiometer including a resistor having one end coupled to receive each of said intermediate pulses and the other end coupled to receive each of said inverted pulses, and a wiper movable relative to said resistor.

9. The system according to claim 7, wherein said means for adjusting the magnitude and polarity of said correction pulses includes a potentiometer including a resistor having one end coupled to receive said first pulse and the other end coupled to received said second pulse, and a wiper movable relative to said resistor.

10. The system according to claim 1, wherein said means for generating said plurality of correction pulses includes a gate, connected to receive said waveform, for generating a first pulse of a predetermined polarity so as to generate a transition of a predetermined direction in response to each of said positive and negative going transitions, and inverter means for generating a second pulse equal in magnitude and of opposite polarity to said first pulse, and means, responsive to said first and second pulses, for generating each of said correction pulses.

11. The system according to claim 10, wherein said means for generating each of said correction pulses includes means for adjusting the magnitude and polarity of said correction pulses.

12. In a sigma delta modulator comprising at least one latch for generating, in response to an analog input signal, a waveform comprising a plurality of binary pulses, each having a different rise time and fall time with respect to the positive going and negative going transitions of each said pulse, and means algebraically adding said waveform to said analog input signal, said modulator further comprising:
  means for generating a plurality of correction pulses, each synchronously with a corresponding positive going or negative going transition of said binary pulses; and
  means for adding each of said correction pulses to said waveform so that the signal area lost by the rise characteristic of the resulting binary pulses will equal the signal area gained by the fall characteristics of the resulting binary pulses.

13. The modulator according to claim 12, wherein said means for generating said plurality of correction pulses includes (a) a circuit comprising CMOS logic, at least one input terminal for receiving said waveform, and at least one power terminal, (b) means connected to the said power terminal for generating an intermediate pulse in response to each of said positive and negative going transitions of said waveform at said input terminal, and (c) means for generating a correction pulse in response to said intermediate pulse.

14. The modulator according to claim 13, wherein said circuit includes a pair of power terminals, and said modulator further includes (a) means, connected to both of said power terminals, for generating a pair of intermediate pulses in response to each of said positive and negative going transitions of said waveform at said input terminal, and (b) means for generating each of said correction pulses in response to a corresponding pair of said intermediate pulses.

15. The modulator according to claim 14, wherein said pair of intermediate pulses are equal in magnitude and pulse width and opposite in polarity to one another, and said means for generating each of said correction pulses includes means for adjusting the magnitude and polarity of said correction pulses.

16. The modulator according to claim 15, wherein said means for adjusting the magnitude and polarity of said correction pulses includes a potentiometer including a resistor having one end coupled to one of said power terminals of said circuit, and the other end coupled to the other of said power terminals and a wiper movable relative to said resistor.

17. The modulator according to claim 13, wherein said means connected to the said power terminal for generating said an intermediate pulse includes means responsive to said intermediate pulse for generating an inverted pulse equal in magnitude and pulse width and opposite in polarity to said intermediate pulse, and means responsive to said intermediate pulse and said inverted pulse for generating said correction pulse.

18. The modulator according to claim 17 wherein said circuit is said latch of said modulator.

19. The modulator according to claim 17, wherein said means for generating each of said correction pulses includes means for adjusting the magnitude and polarity of said correction pulses.

20. The modulator according to claim 19, wherein said means for adjusting the magnitude and polarity of said correction pulses includes a potentiometer including a resistor having one end coupled to receive said first pulse and the other end coupled to received said second pulse, and a wiper movable relative to said resistor.

21. The modulator according to claim 19, wherein said means for adjusting the magnitude and polarity of said correction pulses includes a potentiometer including a resistor having one end coupled to receive said intermediate pulse and the other end coupled to receive said inverted pulse, and a wiper movable relative to said resistor.

22. The modulator according to claim 20, wherein said means for generating each of said correction pulses includes means for adjusting the magnitude and polarity of said correction pulses.

23. The modulator according to claim 12, wherein said means for generating said plurality of correction pulses includes a gate connected to receive said waveform, for generating a first pulse of a predetermined polarity so as to generate a transition of a predetermined direction in response to each of said positive and negative going transitions, and inverter means for generating a second pulse equal in magnitude and of opposite polarity to said first pulse, and means, responsive to said first and second pulses, for generating each of said correction pulses.

24. A system for use in correcting errors in a waveform comprising a plurality of binary pulses, each having a different rise time and fall time with respect to the positive and negative going transitions of each said pulse, said system comprising:

means for generating a plurality of correction pulses, in response to said waveform, representative of the differences in signal area between the rise and fall characteristics of said waveform; and means for adding each of said correction pulses to said waveform so that the signal areas of the rise and fall characteristics of the resulting waveform are substantially equal.

* * * * *

UNITED STATES PATENT AND TRADEMARK OFFICE
CERTIFICATE OF CORRECTION

PATENT NO.   :   4,924,226
DATED        :   May 8, 1990
INVENTOR(S)  :   Adams, Robert W.

It is certified that error appears in the above-identified patent and that said Letters Patent is hereby corrected as shown below:

Claim 4, column 9, line 1, delete "said" (second occurence);

Claim 9, column 9, line 37, delete "received" and substitute therefor -- receive --;

Claim 17, column 10, line 37, delete "an";

Claim 20, column 10, line 53, delete "received" and substitute therefor -- receive --;

Claim 22, column 10, line 63, delete "20" and substitute therefor -- 21 --

Signed and Sealed this

Sixteenth Day of July, 1991

*Attest:*

HARRY F. MANBECK, JR.

*Attesting Officer*        *Commissioner of Patents and Trademarks*